(12) United States Patent
Krumbholz et al.

(10) Patent No.: US 10,899,154 B2
(45) Date of Patent: Jan. 26, 2021

(54) METHOD FOR PRODUCING A SENSOR STRUCTURE AND SENSOR HAVING THE SENSOR STRUCTURE

(71) Applicant: WIKA Alexander Wiegand SE & Co. KG, Klingenberg (DE)

(72) Inventors: Anna Maria Krumbholz, Heigenbruecken (DE); Ulrich Demuth, Erbach (DE)

(73) Assignee: WIKA Alexander Wiegand SE & Co. KG, Klingenberg (DE)

( * ) Notice: Subject to any disclaimer, the term of this patent is extended or adjusted under 35 U.S.C. 154(b) by 294 days.

(21) Appl. No.: 16/033,538

(22) Filed: Jul. 12, 2018

(65) Prior Publication Data

US 2019/0016166 A1 Jan. 17, 2019

(30) Foreign Application Priority Data

Jul. 13, 2017 (DE) .......................... 10 2017 006 634

(51) Int. Cl.
| | |
|---|---|
| B41M 5/382 | (2006.01) |
| G01L 1/22 | (2006.01) |
| G01L 9/00 | (2006.01) |
| H05K 3/04 | (2006.01) |

(52) U.S. Cl.
CPC ........... *B41M 5/382* (2013.01); *G01L 1/2287* (2013.01); *G01L 9/0051* (2013.01); *H05K 3/046* (2013.01); *H05K 2203/107* (2013.01)

(58) Field of Classification Search
CPC .......................... H05K 2203/107; H05K 3/046
See application file for complete search history.

(56) References Cited

U.S. PATENT DOCUMENTS

| | | | | |
|---|---|---|---|---|
| 4,752,455 A | * | 6/1988 | Mayer .................... | B23K 20/08 219/121.6 |
| 4,895,735 A | * | 1/1990 | Cook .................... | C23C 14/048 156/234 |
| 5,173,441 A | * | 12/1992 | Yu ......................... | C23C 14/048 219/121.68 |
| 5,292,559 A | * | 3/1994 | Joyce, Jr. ................ | C23C 26/00 156/272.8 |
| 5,683,601 A | * | 11/1997 | Tatah .................... | C23C 14/048 174/250 |
| 6,025,110 A | * | 2/2000 | Nowak ................... | B29C 59/16 430/200 |
| 6,159,832 A | * | 12/2000 | Mayer ................... | C23C 14/048 257/E21.169 |
| 6,177,151 B1 | * | 1/2001 | Chrisey ................ | C23C 14/048 219/121.85 |
| 6,440,503 B1 | * | 8/2002 | Merdan ................ | C23C 14/048 219/121.78 |

(Continued)

FOREIGN PATENT DOCUMENTS

| | | | | |
|---|---|---|---|---|
| JP | 06167472 A | * | 6/1994 | |
| JP | 2007322184 A | * | 12/2007 | |

*Primary Examiner* — David A. Rogers
(74) *Attorney, Agent, or Firm* — Muncy, Geissler, Olds & Lowe, P.C.

(57) ABSTRACT

A sensor structure and a method for producing the sensor structure. A base material is applied to a transfer support. The transfer support is arranged on a sensor body, and at least parts of the base material are transferred from the transfer support to the sensor body via local energy input.

18 Claims, 5 Drawing Sheets

(56) References Cited

U.S. PATENT DOCUMENTS

| | | | | |
|---|---|---|---|---|
| 6,445,565 B1* | 9/2002 | Toyoda | G01N 27/225 | 257/301 |
| 7,032,448 B2* | 4/2006 | Hamamoto | G01N 27/225 | 361/280 |
| 7,609,068 B2* | 10/2009 | Ripley | G01N 15/0656 | 324/500 |
| 8,056,222 B2* | 11/2011 | Pique | H05K 1/183 | 29/832 |
| 8,728,589 B2* | 5/2014 | Auyeung | H05K 3/046 | 427/595 |
| 9,102,007 B2* | 8/2015 | Hosseini | H01L 21/78 | |
| 9,925,797 B2* | 3/2018 | Kotler | C23C 14/28 | |
| 2008/0038487 A1* | 2/2008 | Barron | C23C 14/048 | 427/596 |
| 2008/0318030 A1* | 12/2008 | Handy | H01L 21/6835 | 428/332 |
| 2009/0074987 A1* | 3/2009 | Auyeung | C23C 14/28 | 427/596 |
| 2009/0217517 A1* | 9/2009 | Pique | H05K 3/321 | 29/832 |
| 2010/0022078 A1* | 1/2010 | Rockenberger | C09D 11/101 | 438/585 |
| 2010/0084384 A1* | 4/2010 | Bovatsek | B29C 65/1616 | 219/121.64 |
| 2012/0080088 A1* | 4/2012 | Grabitz | H01L 24/03 | 136/256 |
| 2013/0069785 A1* | 3/2013 | Subramanian | G06K 19/07749 | 340/572.3 |
| 2013/0126573 A1* | 5/2013 | Hosseini | B23K 26/0622 | 225/2 |
| 2013/0189687 A1* | 7/2013 | Tanaka | C12C 1/6827 | 435/6.11 |
| 2014/0167791 A1* | 6/2014 | Feyh | G01N 27/121 | 324/694 |
| 2015/0038313 A1* | 2/2015 | Hosseini | B23K 26/0648 | 501/32 |
| 2015/0146345 A1* | 5/2015 | Kamath | H01L 28/60 | 361/301.4 |
| 2015/0224291 A1* | 8/2015 | Guillemot | C12M 21/08 | 604/290 |
| 2016/0233089 A1* | 8/2016 | Zenou | C23C 26/02 | |
| 2017/0189995 A1* | 7/2017 | Zenou | H05K 3/18 | |
| 2017/0250294 A1* | 8/2017 | Zenou | B23K 26/0624 | |

* cited by examiner

METHOD FOR PRODUCING A SENSOR STRUCTURE AND SENSOR HAVING THE SENSOR STRUCTURE

This nonprovisional application claims priority under 35 U.S.C. § 119(a) to German Patent Application No. 10 2017 006 634.5, which was filed in Germany on Jul. 13, 2017, and which is herein incorporated by reference.

BACKGROUND OF THE INVENTION

Field of the Invention

The present invention relates to a method for producing a sensor structure and to a sensor having this sensor structure. The method comprises a transfer and a melting on of layers. The sensor having a sensor body and the sensor structure is used in a detection system for a physical variable.

Description of the Background Art

Conventional methods for producing a sensor structure on a sensor body are complicated, expensive, and not suitable for the economic application of the sensor structures to curved surfaces.

SUMMARY OF THE INVENTION

It is therefore an object of the present invention to create a cost-effective solution for producing a sensor structure on a sensor body and in particular on curved surfaces of the sensor body and to provide a corresponding sensor. In addition, a structure is to be created for measuring a physical variable, for example, a pressure, flow, or temperature, wherein or for which a measuring resistor is provided on the sensor body. Furthermore, preferably very uniform, thin structural layers are to be produced, wherein this is to occur in one or a few operations.

The method of the invention for producing a sensor structure comprises the following steps: applying a base material to a transfer support; arranging the transfer support on a sensor body; and transferring at least parts of the base material from the transfer support to the sensor body by means of local energy input.

By means of the method, the base material for the sensor structure is transferred step by step from the transfer support to the sensor body directly by means of the local energy input. This selective transfer process enables an economic production or deposition of a sensor structure. When a flexible transfer support is used, the sensor structure can be produced inexpensively even on curved surfaces of the sensor body.

An advantage of the method of the invention is that no etching processes are necessary. The difficulty in etching is that the concentration of the etching solution must be as constant as possible and therefore is changed frequently, and its homogeneity must be ensured. Because the etching rate usually increases with temperature, stable and precise heating is important for reproducibility. These disadvantages of etching are eliminated in the method of the invention.

The method can additionally comprises the following steps: removing the transfer support after transferring the base material; and conditioning and/or irradiating the sensor structure transferred to the sensor body. Conditioning can comprise heating or resintering. The sensor structure is again partially removed or partially separated by irradiation.

The subsequent heat treatment serves to improve the surface, the homogeneous structure, and the edge formation of the applied sensor structure. The sensor structure can be fabricated even more accurately with the selective irradiation, or inaccuracies during the transfer of the base material can be compensated or mitigated.

The method can additionally comprises the following steps: applying an insulating layer to the sensor body prior to transferring the base material. The thickness of the insulating layer can be, for example, 1 to 10 µm. Further, the insulating layer comprises glass or consists entirely of glass.

The insulating layer prevents unwanted conductive connections between the sensor structure and the sensor body.

The insulating layer is rough and has a reduced peak height $R_{pk}$ from 1 to 6 nm and a reduced valley depth $R_{vk}$ from 1 to 6 nm. The range in which the values for $R_{pk}$ and $R_{vk}$ lie depends mainly on the material properties of the base body.

This describes a surface similar to a plateau with deep fine grooves or capillaries. The porosity and roughness promote the transfer or (local) complete wetting of the sensor body by enhancing the adhesion forces between the base material and the sensor body.

The local energy input can be effected by irradiation. This can be done by means of a laser or electron beam.

By using laser or electron beams, the process times or energy input can be precisely controlled, so that the other materials located on the sensor are preserved.

Preferably, the local energy input occurs selectively at predetermined points on the sensor body.

This enables an efficient fabrication of the sensor body which preserves the sensor body or the other materials located on it.

The layer thickness of the base material on the transfer support is preferably 10 to 100 nm. Further, particles of the base material preferably have a diameter of 1 to 100 nm; i.e., they are so-called nanoparticles.

Thus, very thin sensor structure layers can be produced. The selection of the grain size of the base material particles has a significant influence on process success. With decreasing grain size, the compression rate increases, as does the grain growth rate. By reducing the particle size, the relative surface increases, and the striving to reduce the surface as well. This can be used for shortening process times and for a lower energy input by the laser or electron beam. The other materials located on the sensor are thus preserved.

The transfer support can consists of or can contain glass or a film.

As a result, the transfer support has a high transmittance in the wavelength of the laser. It is thus possible to carry out the transfer of the base material by means of irradiation by the laser, without having to previously remove the transfer support from the sensor body. In addition, use of the transfer support as a mask would be conceivable if it consists only partially of glass or the film has heterogeneous properties and it can thus partially shield the energy input.

The base material can be applied to the transfer support electrostatically, by sputtering, in a vapor phase, or chemically.

Thus, the application of the base material to the transfer support is very variable and the application method can be selected with regard to the desired properties of the base material layer in consideration of the cost effectiveness.

The sensor of the invention can have a sensor body and the sensor structure produced by the method described above. The sensor can have the insulating layer described above.

The sensor can have a sensor body on which a sensor structure is produced or deposited by means of a selective transfer process.

The material for the sensor structure can be transferred directly from a transfer support stepwise to the sensor body by means of local energy input.

The surface and the homogeneous structure of the applied structures, as well as the edge formation can be improved by subsequent heat treatment of the sensor body.

Further, it is possible to apply metal structures to the sensor element by means of selective laser or electron beam-powder build-up welding with process gas. In this method, a powdered metal material is welded onto an existing sensor body. The application of structures according to the invention to curved surfaces requires no adhesive bonds and in the case of selective laser or electron powder welding with process gas also no transfer film (transfer support).

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
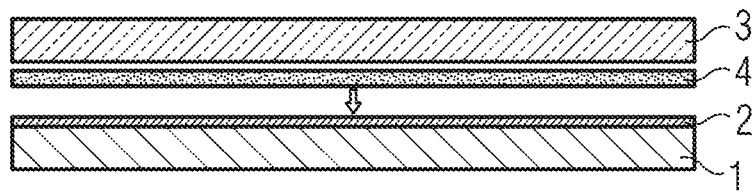
FIG. 1A shows the structure of the sensor body and the transfer support to be arranged thereon according to an embodiment of the present invention.

FIG. 1A shows an exemplary structure which can be used in the production of a sensor structure according to the invention. An insulating layer 2 has preferably been applied to or deposited on sensor body 1 before the method of the invention begins. Insulating layer 2 preferably has a thickness of 1 to 10 μm. Insulating layer 2 is preferably rough, with a low $R_{pk}$ value (reduced peak height) and higher $R_{vk}$ value (reduced valley depth). This describes a surface similar to a plateau with deep fine grooves or capillaries. Transfer support 3 is arranged on, under, or next to sensor body 1 and is brought close to it, which is indicated by the arrow.

Transfer support 3 is now placed on sensor body 1. Transfer support 3 is preferably a glass sheet or a film, which has a high transmittance in the wavelength of the laser. The film is flexible and can also be used for curved surfaces.

Transfer support 3 carries base material 4 for sensor structure 5 in a layer with a layer thickness of 10 to 100 nm and a particle size of 1 to 100 nm. The selection of the grain size in this case has a significant impact on process success. With decreasing grain size, the compression rate increases, as does the grain growth rate. By reducing the particle size, the relative surface increases, and the striving to reduce the surface as well. This can be used for shortening process times and for a lower energy input by a laser beam 6 or electron beam. The other materials located on the sensor are thus preserved.

Base material layer 4 was deposited electrostatically, by sputtering, in a vapor phase, or chemically on transfer support 3 before the method of the invention begins.

Figure 1B:
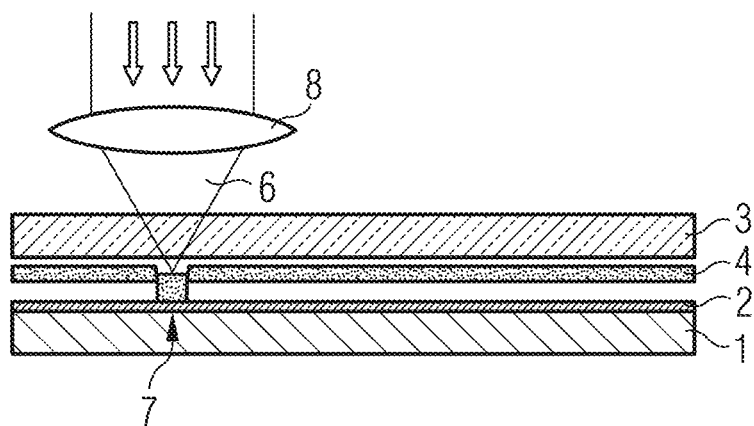
FIG. 1B shows the transfer of a part of the base material from the transfer support to the sensor body by means of a laser or electron beam.

FIG. 1B shows sensor body 1 with optional insulating layer 2 and applied transfer support 3, which carries base material 4 for sensor structure 5. The sandwich unit is now irradiated locally at controlled places 7 by means of laser beam 6 or electron beam.

A local sensor structure 5 is now deposited or built up/printed on sensor body 1 by focusing, e.g., by lenses 8 or magnets. The electron beam can be controlled, focused, and positioned via magnets.

The transfer and melting of sensor structure 5 on sensor body 1 can be carried out by selective melting of base material 4 made of powder. Sensor structure 5 is transferred as a layer from transfer support 3 to sensor body 1 by the local energy input. The transfer occurs in a pulsed or continuous manner or by melting. Further, the transfer occurs in layers or layer by layer.

The base material transfer takes place directly, in a local gas phase, or in a locally forming plasma. Here, the deposition is influenced via focusing, temperature, a separation layer of hydrophobic material on transfer carrier support 3 or the porosity or roughness of the receiving side of sensor body 1, insulating layer 2, an applied voltage, and process gases.

The introduction of laser energy into the metal layer of base material 4 leads to a heating of the metal, which causes the metal to melt. The adhesion forces cause a mechanical cohesion of the two phases. These are enhanced by the porosity and roughness of the receiving side and lead to a complete wetting of the desired points on sensor body 1.

The application of a voltage between the metal layer of base material 4 on transfer support 3 (with a full-area conductive layer/electrode) and sensor body 1 supports the transfer process, wherein a constant distance or contact between transfer support 3 and sensor body 1 is to be ensured.

Optionally, sensor characteristics for the generated layers are measured and stored in the associated evaluation electronics of the sensor system.

Prior to this, conditioning (heating in an oven, resintering of the layers) can be expedient.

It is also conceivable that the layers are previously only transferred by a laser beam 6 or electron beam, and sensor body 1 is then exposed to a higher temperature. Because transfer support 3 is thus less thermally stressed, it can remain reusable.

An insulating layer 2, e.g., made of transparent glass, can also be produced in this way, first or as an intermediate process.

Figure 1C:
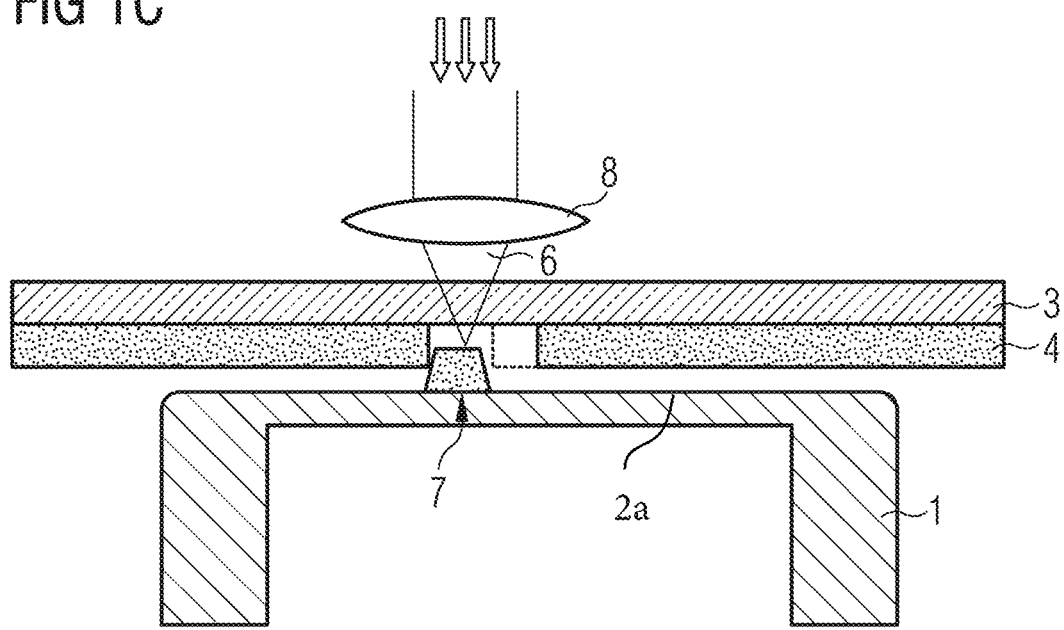
FIG. 1C shows a sensor body in a cross section with a strain sensitive diaphragm and applied transfer support.

FIG. 1C shows a sensor body 1 in a cross section with a strain sensitive diaphragm 2a and applied transfer support 3, which carries the base material 4 for the sensor structure 5. The sandwich unit is irradiated locally at controlled places 7 via a lens 8. Also, the diaphragm 2a can be, for example, a membrane of a pressure sensor body 1, which deflects under pressure at the controlled places 7 and thus would be a part of a resistance on the membrane which change its value under pressure such as a strain gauge.

Figure 2:
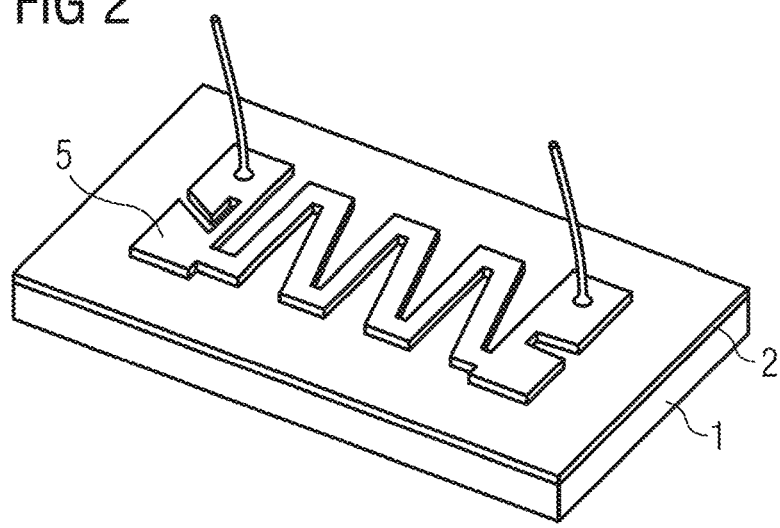
FIG. 2 shows a sensor body according to an embodiment of the invention with an exemplary sensor structure applied thereto.

FIG. 2 shows a sensor body 1 with insulating layer 2 and applied sensor structure 5. Too much applied or excess material can also be trimmed with the laser, and, for example, the adjustment of a measuring bridge or other metrological properties can be improved in this way.

Figure 3A:
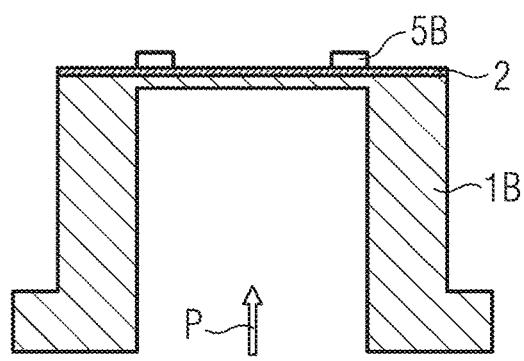
FIG. 3A shows a sectional view of a sensor structure according to an embodiment of the present invention, which is suitable for detecting a pressure.

FIG. 3A shows a sensor structure 5B for a pressure p in cross section. Sensor element 1B has a planar surface with an insulating layer 2. Sensor structure 5B is applied thereon.

Figure 3B:
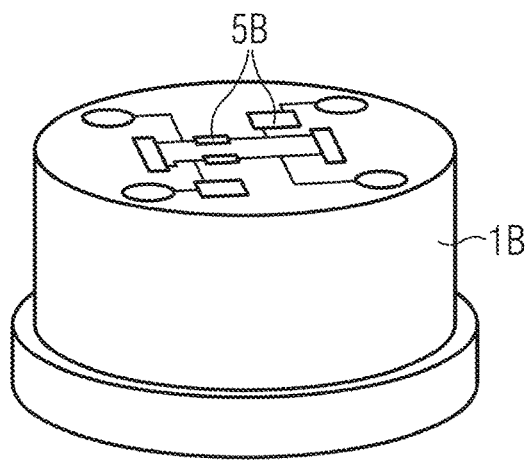
FIG. 3B shows a sensor element according to an embodiment of the invention with an exemplary sensor structure applied thereto.

FIG. 3B shows a sensor element 1B with sensor structure 5B applied thereon. The sensor body can have a size of 3 to 15 mm, preferably 4 to 10 mm in diameter.

Figure 4A:
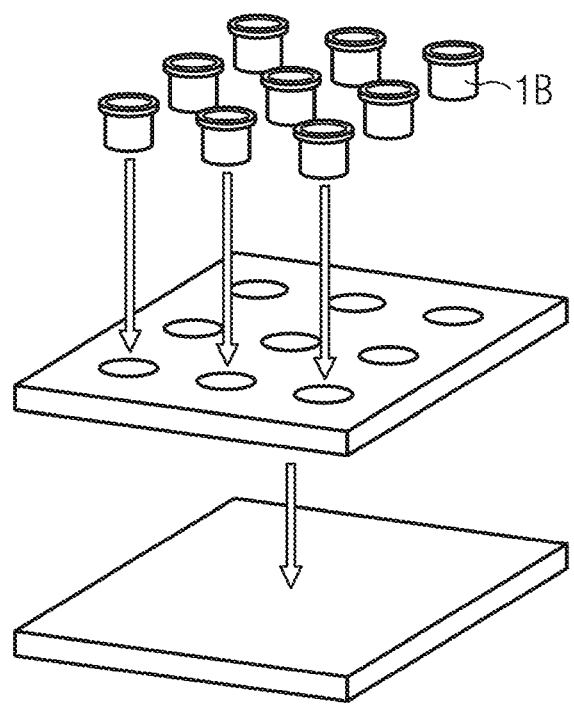
FIG. 4A shows a workpiece support which can hold a plurality of sensor elements.

FIG. 4A shows a workpiece support which can hold a plurality of sensor elements 1B. The bottom side, together with the workpiece support, forms a planar surface.

Figure 4B:
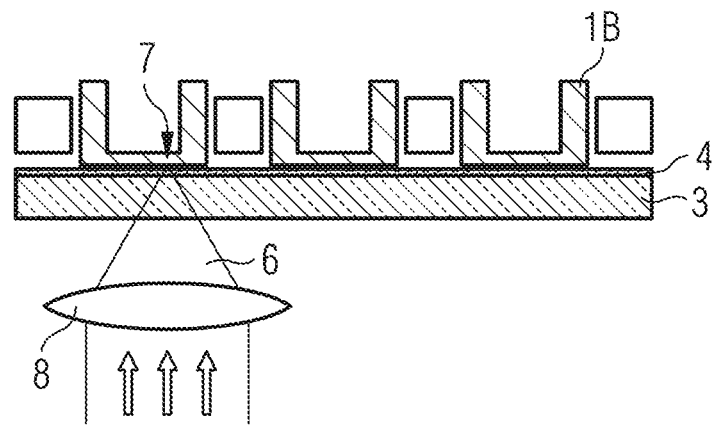
FIG. 4B shows a radiation source together with the transfer support, the base material, and the sensor elements.

FIG. 4B shows a radiation source, together with transfer support 3 with base material 4 and sensor elements 1B.

Figure 5A:
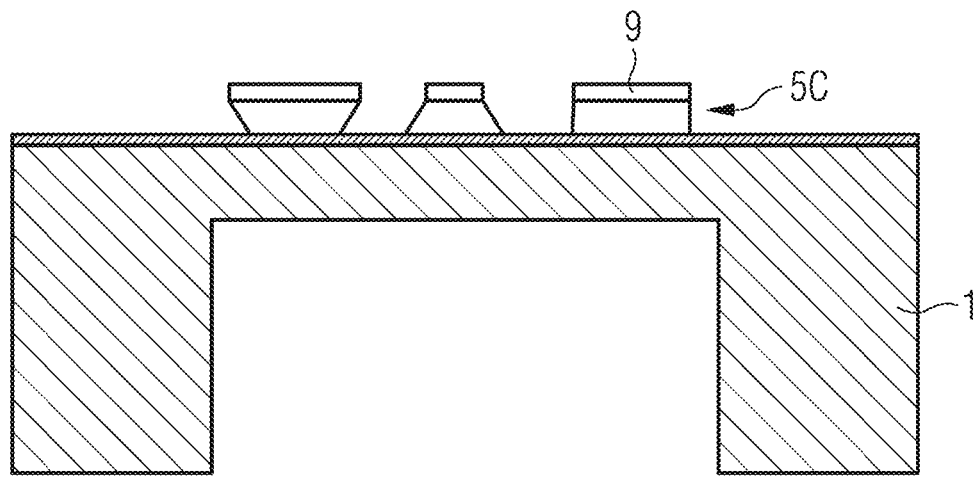
FIG. 5A shows a sectional view of a conventional sensor structure.

FIG. 5A shows a conventional sensor structure which was produced using an etching process. This creates (sharp) edges and trapezoidal structures. In particular, in this production process, a photoresist layer 9 remains on sensor structure 5C.

Figure 5B:
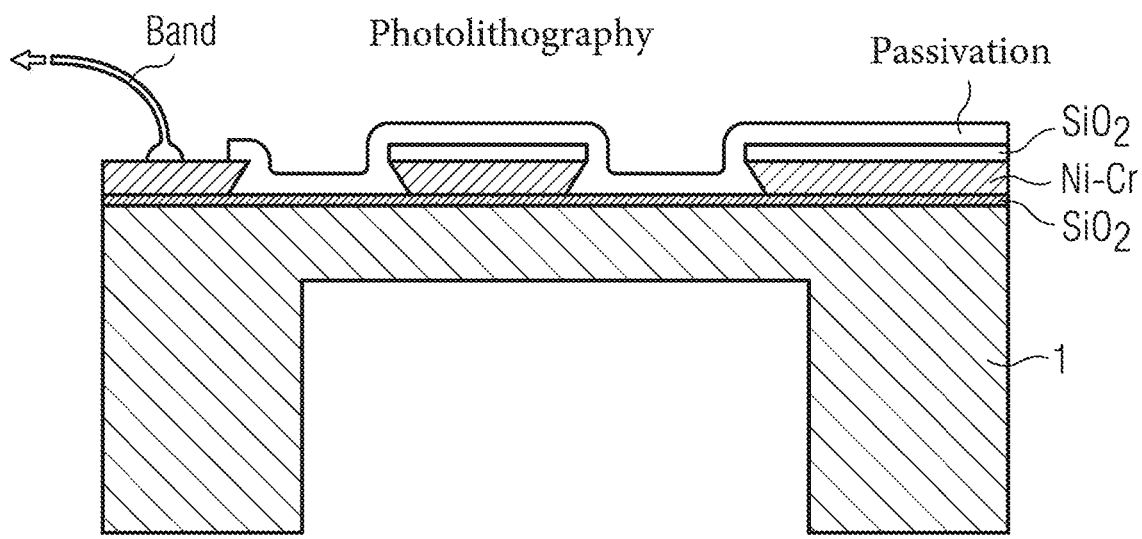
FIG. 5B shows a conventional photolithography process in which a photoresist layer remains on the sensor structure.

FIG. 5B shows a conventional photolithography process in which photoresist layer 9 remains on the sensor structure and a passivation layer has been produced as the uppermost layer on the sensor structure.

Figure 6A:
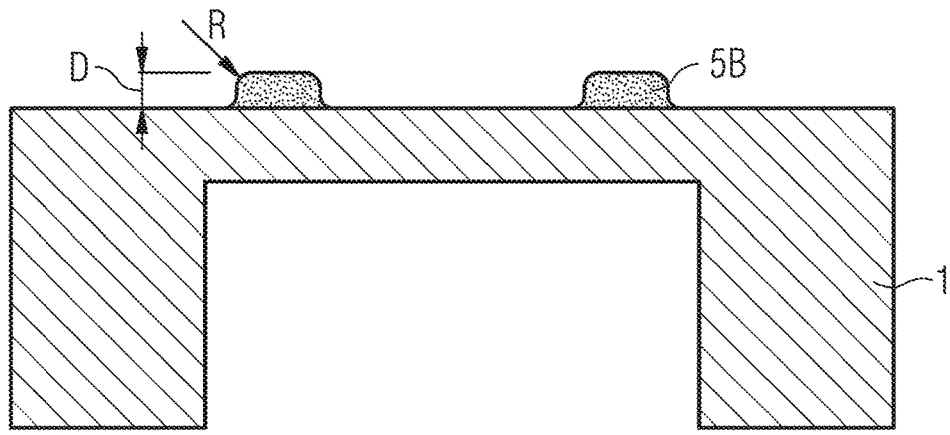
FIG. 6A shows a sectional view of a sensor structure of the invention applied to a sensor body.

FIG. 6A shows a sectional view of a sensor structure 1B of the invention applied to a sensor body 1. In contrast to the sensor structures produced by conventional methods, it is possible with the production method of the invention to produce rounded corners with a radius R by the subsequent heat treatment.

Thus, the sensor structure of the invention preferably has in a sectional view the shape of a trapezoid whose long side is closer to the sensor body than the short side and whose upper corners are rounded. Their height, i.e., the layer thickness D of the sensor structure, is preferably 10 to 100 nm.

The horizontal trapezoid described above is preferred, but in the meantime there is also the so-called lift-off method, which as a result is somewhat similar to the method described above and can also produce an inverted trapezoid.

Figure 6B:
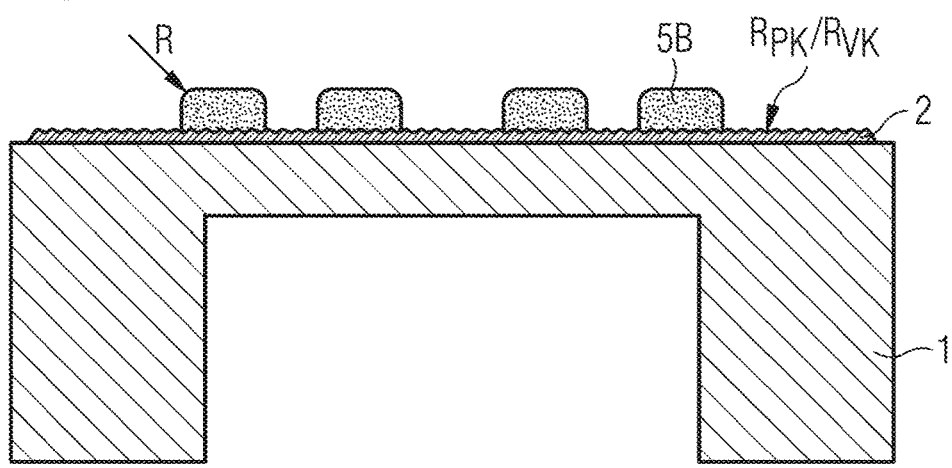
FIG. 6B shows a sectional view of a sensor structure of the invention applied to a sensor body, wherein an insulating layer is arranged between the sensor body and the sensor structure.

FIG. 6B shows a sectional view of a sensor structure 5B of the invention applied to a sensor body 1, wherein, in contrast to the arrangement shown in FIG. 6A, an insulating layer 2 is arranged between sensor body 1 and sensor structure 5B. The reduced peak height $R_{pk}$ and the reduced valley depth $R_{vk}$ of insulating layer 2 are each 1 to 6 nm and depend mainly on the material properties of sensor body 1.

Figure 6C:
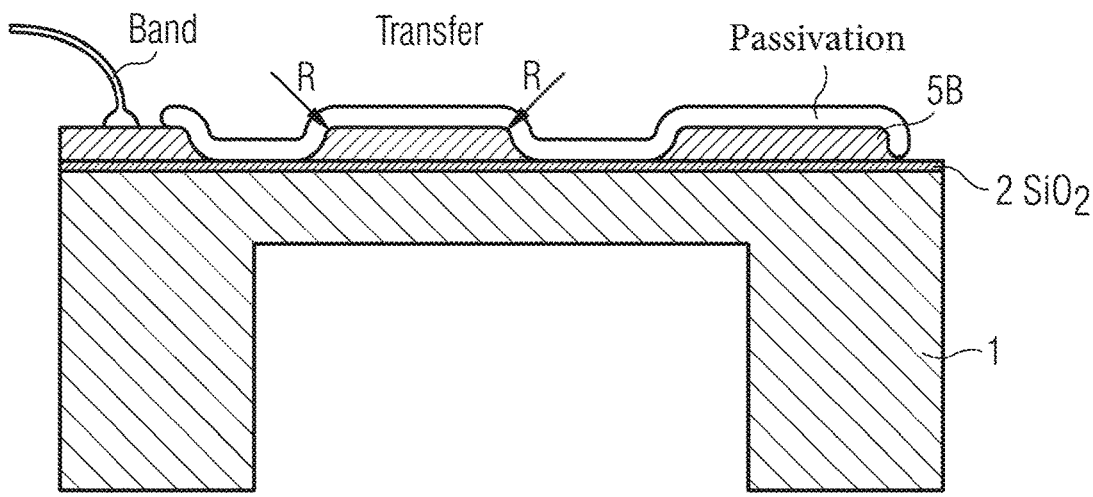
FIG. 6C shows the sensor structure, produced by the transfer method of the invention, on a sensor body.

FIG. 6C shows sensor structure 5B produced by the transfer method of the invention on a sensor body 1. In this case, insulating layer 2, which, for example, consists of or contains silicon oxide ($SiO_2$), is preferably between sensor body 1 and the sensor structure. Sensor structure 5B has in cross section the shape of the horizontal trapezoid with rounded corners with a radius R and consists of or contains, for example, a nickel-based alloy, preferably a Ni—Cr alloy. A protective layer, which consists of or contains, for example, silicon oxide ($SiO_2$) has been produced by means of passivation over sensor structure 5B and insulating layer 2.

The transfer method of the invention, in contrast to the conventional etching method, manages without the use of a photoresist. As a result, the sensor structure produced by the transfer method of the invention does not have a photoresist layer.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for producing a sensor structure, the method comprising:
    applying a base material to a transfer support;
    arranging the transfer support on a sensor body;
    transferring at least parts of the base material from the transfer support to the sensor body via a local energy input, the parts of the base material transferred to the sensor body forming the sensor structure;
    removing the transfer support after transferring the base material; and
    conditioning the sensor structure transferred to the sensor body, such that the sensor structure, when viewed in a sectional view, has a shape of a trapezoid whose long side is closer to the sensor body than a short side and which has rounded corners.

2. The method for producing a sensor structure according to claim 1, further comprising:
    irradiating the sensor structure transferred to the sensor body.

3. The method for producing a sensor structure according to claim 2, wherein the sensor structure is partially removed or partially separated by the irradiating of the sensor structure.

4. The method for producing a sensor structure according to claim 1, further comprising:
    applying an insulating layer to the sensor body prior to transferring the base material, wherein a thickness of the insulating layer is about 1 to 10 µm.

5. The method for producing a sensor structure according to claim 4, wherein the insulating layer comprises glass or consists of glass.

6. The method for producing a sensor structure according to claim 4, wherein the insulating layer is rough and has a reduced peak height Rpk from 1 to 6 nm and a reduced valley depth Rvk from 1 to 6 nm.

7. The method for producing a sensor structure according to claim 1, wherein the transfer occurs in a pulsed or continuous manner or by melting.

8. The method for producing a sensor structure according to claim 1, wherein the conditioning comprises a heat treatment or resintering.

9. The method for producing a sensor structure according to claim 1, wherein the local energy input is effected via irradiation, a laser, or an electron beam.

10. The method for producing a sensor structure according to claim 1, wherein the local energy input occurs selectively at predetermined points on the sensor body.

11. The method for producing a sensor structure according to claim 1, wherein a layer thickness of the base material on the transfer support is 10 to 100 nm.

12. The method for producing a sensor structure according to claim 1, wherein particles of the base material have a diameter of 1 to 100 nm.

13. The method for producing a sensor structure according to claim 1, wherein the transfer support comprises or consists of glass or a film.

14. The method for producing a sensor structure according to claim 1, wherein the base material is applied to the transfer support electrostatically, by sputtering, in a vapor phase, or chemically.

15. A sensor, comprising:
a sensor body; and
a sensor structure arranged on the sensor body, the sensor structure being formed by parts of a base material that were transferred from a transfer support to the sensor body via a local energy input,
wherein the sensor structure, when viewed in a sectional view, has a shape of a trapezoid whose long side is closer to the sensor body than a short side and which has rounded corners.

16. The sensor according to claim 15, further comprising an insulating layer.

17. The sensor according to claim 15, wherein the sensor body has a size of 3 to 15 mm or 4 to 10 mm in diameter.

18. The sensor according to claim 15, wherein the sensor structure does not have a photoresist layer.

* * * * *